United States Patent [19]

Ichimura et al.

[11] Patent Number: 4,920,030

[45] Date of Patent: Apr. 24, 1990

[54] PHOTOSENSITIVE COATING EMULSION FOR PLASTIC FILMS

[75] Inventors: Kunihiro Ichimura, Yatabemachi; Keiji Kubo, Hyogo, both of Japan

[73] Assignees: General Director of the Agency of Industrial Science and Technology, Tokyo; Daicel Chemical Industries, Ltd., Osaka, both of Japan

[21] Appl. No.: 298,855

[22] Filed: Jan. 19, 1989

Related U.S. Application Data

[63] Continuation of Ser. No. 30,835, Feb. 4, 1987, abandoned.

[51] Int. Cl.$^5$ .............................................. G03C 1/76
[52] U.S. Cl. ..................................... 430/270; 430/28; 430/271; 430/287; 525/61; 525/375; 522/149
[58] Field of Search ............... 430/270, 271, 287, 28; 525/61, 375; 522/149

[56] References Cited

U.S. PATENT DOCUMENTS

| | | | |
|---|---|---|---|
| 4,339,524 | 7/1982 | Ichimura et al. | 430/270 |
| 4,428,977 | 10/1984 | Sperry et al. | 430/270 |
| 4,564,580 | 1/1986 | Ichimura et al. | 430/270 |

*Primary Examiner*—Jack P. Brammer

[57] ABSTRACT

A photosensitive coating emulsion for a plastic film comprising an emulsion containing a film-forming polymer and a photocrosslinkable polyvinyl alochol containing a photocrosslinkable constituent unit, which further comprises (1) an aliphatic alcohol having eight carbon atoms as an anti-foaming agent, or (2) a dispersion medium of the emulsion composed of 95 to 50% by weight of water and 5 to 50% by weight of at least one lower aliphatic alcohol selected from the group consisting of methyl, ethyl, n-propyl and i-propyl alcohols, or (3) an acetylenic glycol or alcohol as an anti-foaming agent. These emulsions can give a coating film free from unevenness in coating.

8 Claims, No Drawings

PHOTOSENSITIVE COATING EMULSION FOR PLASTIC FILMS

This application is a continuation, of application Ser. No. 07/030,835 filed on Feb. 4, 1987, now abandoned.

FIELD OF INDUSTRIAL APPLICATION

The present invention relates to a photosensitive coating emulsion for a plastic film. Particularly, it relates to a photosensitive coating emulsion which is suitable for image formation to give a coating film free from unevenness due to foaming or cissing during coating work.

PRIOR ART

A photosensitive material obtained by coating a plastic film with a photosensitive emulsion comprising polyvinyl alcohol or polyvinyl acetate emulsion and a dichromate and/or a diazo compound has been known as a photosensitive image-forming material suitable for various fields such as screen processing or the like.

However, though the dichromate which is used in the above photosensitive emulsion as a sensitizer is highly sensitive, the photosensitive emulsion containing the same tends to readily undergo dark reaction after coating, so that the operation step is restricted. Further, the use of the dichromate itself is also restricted, because chromium (VI) causes environmental pollution. On the other hand, the diazo compound is less sensitive than the dichromate and undergoes dark reaction rather slowly. Consequently, the diazo compound is not always satisfactory as a sensitizer.

Further, some highly photosensitive compositions which neither cause dark reaction nor contain any metal which acts as a source of environmental pollution were proposed. For example, Japanese Patent Publication No. 40814/1981 discloses a photosensitive emulsion for screen processing which comprises a stilbazolium group-containing photocrosslinkable polyvinyl alcohol and a film-forming polymer, while Japanese Patent Laid-Open No. 194905/1983 discloses an emulsion which comprises a chalcone group-containing photocrosslinkable polyvinyl alcohol and a film-forming polymer.

Problem to be Solved by the Invention

When, however, such a photosensitive emulsion was applied to a plastic film such as a polyethylene terephthalate film with an ordinary device such as a roll, air knife, curtain or slit coater and dried, significant unevenness of coating due to foaming and cissing which was caused in the preparation step of the photosensitive emulsion or the coating step was present on the surface of the coating, thus giving imprecise images.

The inventors of the present invention have studied various anti-foaming agents to prevent the foaming and cissing.

Generally, mineral oil, fatty oil, fatty acid, fatty acid ester, alcohol, silicone, polyalkylene glycol, fluorine compound or a mixture thereof or the like is used as an anti-foaming agent in various steps of textile, dye, paper pulp, synthetic rubber latex, paint or synthetic resin industry or the like.

Means for Solving the Problem

The inventors of the present invention attempted to coat a substrate such as polyethylene terephthalate film with a composition obtained by adding an ordinary anti-foaming agent such as the one described above to a photosensitive emulsion comprising a film-forming polymer and a photocrosslinkable polyvinyl alcohol and found that some of the ordinary anti-foaming agents effectively prevented foaming but caused cissing, while the others prevented cissing but could not prevent foaming sufficiently. As a result of an additional study, they have found that an aliphatic alcohol having eight carbon atoms exhibits an excellent anti-foaming effect and gives a coating film having an excellent appearance, while it does not lower the preformance such as sensitivity, resolving power, resistance to printing, solvent resistance or the like. The present invention has been accomplished on the basis of this finding.

The present invention relates to a photosensitive coating emulsion for a plastic film comprising an emulsion containing a film-forming polymer and a photocrosslinkable polyvinyl alcohol containing at least one photocrosslinkable constituent unit selected from the group consisting of units represented by the general formula (I):

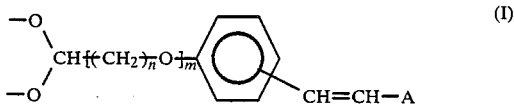

(I)

wherein A is a group represented by the general formula:

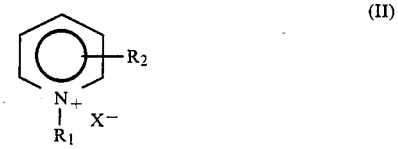

(II)

or

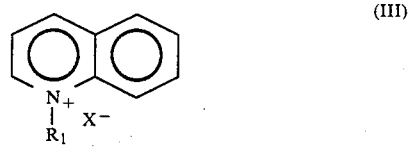

(III)

(wherein $R^1$ represents a hydrogen atom or an alkyl or aralkyl group which may contain a hydroxyl or carbamoyl group or an ether or unsaturated bond, $R^2$ represents a hydrogen atom or a lower alkyl group, $X^-$ represents an anion m represents 0 or 1, and n represents a positive number of 1 to 6, and units represented by the general formula (IV):

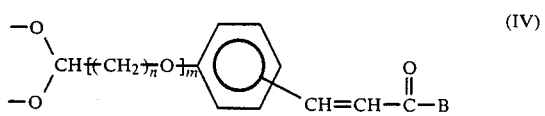

(IV)

or the general formula (V):

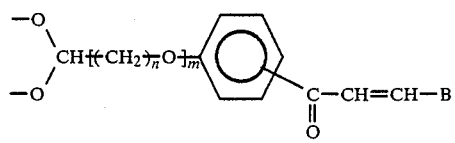

(V)

wherein B represents an aromatic or heterocyclic group having at least one polar group and m and n are as defined above,
characterized by further containing an aliphatic alcohol having eight carbon atoms as an anti-foaming agent.

Although the photosensitive emulsion of the present invention contains the above anti-foaming agent, it is not adversely affected by the presence of the anti-foaming agent. Further, when it was applied to a plastic film and dried, the drying characteristics were not remarkably lowered and neither foaming nor cissing was observed on the surface of the coating film.

The screen processing with the above photosensitive emulsion of the present invention is carried out as follows: The photosensitive emulsion of the present invention is applied to a plastic film such as polyethylene terephthalate film to prepare a photosensitive film. This film is stuck on a screen plate with water or a photosensitive emulsion. After drying, the plastic film is removed to form a photosensitive coating film having a uniform thickness on the screen plate.

Now the present invention will be described in more detail by referring to examples where the emulsion will be used in screen processing, though the present invention is not limited to this use.

Examples of the emulsion containing a film-forming polymer to be used in the present invention include vinyl acetate emulsion, acrylic emulsion, ethylene-vinyl acetate emulsion, ethylene-acrylic emulsion, SBR latex, vinyl chloride emulsion and vinylidene chloride emulsion.

The photocrosslinkable polyvinyl alcohol to be used in the photosensitive emulsion of the present invention can be prepared by introducing a photo-crosslinkable unit represented by the general formula (I), (IV) or (V) into a polyvinyl alcohol prepared by completely or partially saponifying a polyvinyl acetate. The introduction of the photocrosslinkable unit can be carried out by a known method, such as one described in Japanese Patent Publication Nos. 5761/1981 or 5762/1981, Japanese Patnet Laid-Open No. 194905/1983 or the like. Now, a synthesis of a polyvinyl alcohol containing a photocrosslinkable unit represented by the general formula (I) will be described as a representative example: Polyvinyl alcohol is reacted with a stilbazolium or styrylquinolinium salt represented by the general formula (VI) or (VII):

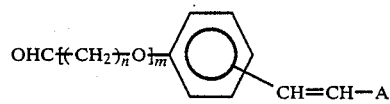

(VI)

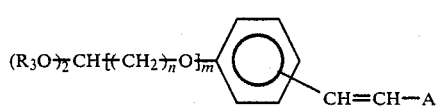

(VII)

wherein A, m and n are as defined above and $R^3$ groups each represents a lower alkyl group or the two $R^3$ groups may together form a lower alkylene group, in the presence of an acid catalyst to obtain a photocrosslinkable polyvinyl alcohol.

Examples of the compound of the general formula (VI) include 1-methyl-2-(p-formylstyryl)pyridinium, 1-methyl-4-(p-formylstyryl)pyridinium, 1-ethyl-2-(p-formylstyryl)pyridinium, 1-ethyl-4-(p-formylstyryl)pyridinium, 1-allyl-4-(p-formylstyryl)pyridinium, 1-(2-hydroxyethyl)-2-(p-formylstyryl)pyridinium, 1-(2-hydroxyethyl)-4-(p-formylstyryl)pyridinium, 1-carbamoylmethyl-2-(p-formylstyryl)pyridinium, 1-carbamoylmethyl-4-(p-formylstyryl)pyridinium, 1-methyl-2-(m-formylstyryl)pyridinium, 1-benzyl-2-(p-formylstyryl)pyridinium, 1-benzyl-4-(p-formylstyryl)pyridinium, 1-methyl-4-(p-formylstyryl)-5ethylpyridinium, 1-methyl-2-(p-formylstyryl)quinolinium, 1-ethyl-2-(p-formylstyryl)quinolinium and 1-ethyl-4-(p-formylstyryl)quinolinium.

The compound represented by the general formula (VII) may be an acetal of the compound represented by the general formula (VI). Further, examples of the anion $X^-$ include halide, phosphate, sulfate, methosulfate and p-toluenesulfonate ions.

The aromatic or heterocyclic group having a polar group "B" of the photocrosslinkable constituent unit represented by the general formula (IV) or (V) may be an aromatic or heterocyclic group substituted with a carboxyl group or its salt, a sulfo group or its salt or a primary, secondary or tertiary amine or their salt involving a quaternary salt of a tertiary amine.

It is preferred that the photocrosslinkable polyvinyl alcohol has a degree of saponification of 75 molar % or above and an average degree of polymerization of 300 to 3000.

If the average degree of polymerization is less than 300, the mechanical strength and the water resistance will be poor, while if it exceeds 3000, the solution of the composition will exhibit a remarkably high viscosity to result in difficult coating. Further, the solubility in water in the development step will be low, so that an unexposed part will be hardly washed out, which is unfavorable.

If a polyvinyl alcohol having a degree of saponification of less than 75 molar % is used, the solubility in water will be low and the obtained coating film will be soft and have an insufficient strength.

The content of the photocrosslinkable unit is preferably 0.5 to 10 molar % based on the constituent unit of the polyvinyl alcohol. If the content is higher than 10 molar %, the reaction mixture will exhibit a remarkably high viscosity to result in difficult preparation. Further, the solubility of the obtained photosensitive resin composition in water will be poor.

The weight ratio (on the solid basis) of the emulsion containing a film-forming polymer to the photocrosslinkable polyvinyl alcohol in the photosensitive emulsion of the present invention is preferably between 100:10 and 100:200.

If the amount of the photocrosslinkable polyvinyl alcohol to be added per 100 parts by weight of the emulsion is less than 10 parts by weight, the resulting coating film will exhibit a low solvent resistance to result in poor resistance to printing. Further, the unexposed part will be difficult wash out resulting in insufficient development. On the contrary, if the amount exceeds 200 parts by weight, the water resistance and smoothness of the surface will be poor and the sensitivity will be lowered.

According to the present invention, the anti-foaming agent must be an aliphatic alcohol having eight carbon atoms and examples thereof include 1-octyl alcohol, 2-octyl alcohol, 2-ethylhexyl alcohol and mixtures of two or more of these alcohols.

The amount of the anti-foaming agent is 0.0001 to 0.01% by weight, preferably 0.0005 to 0.005% by weight, based on the amount of the photosensitive emulsion.

If the amount is less than 0.0001% by weight, no anti-foaming effect will be obtained, while if it exceeds 0.01% by weight, cissing will occur.

Further, the use of aliphatic alcohols having the number of carbon atoms of other than 8 was attempted. For example, an aliphatic alcohol having the number of carbon atoms of 6 or below could not exhibit any anti-foaming effect because it was soluble in water. On the contrary, an aliphatic alcohol having the number of carbon atoms of 10 or above could not exhibit any anti-foaming effect because it was insoluble in water, and caused cissing.

According to the present invention, an aliphatic alcohol having eight carbon atoms may be added together with other ordinary anti-foaming agent or acetylenic glycol or alcohol which has already been proposed by the inventors of the present invention.

Further, the dispersion medium of the photosensitive emulsion containing such an anti-foaming agent may be a mixture of water with methyl, ethyl, propyl or isopropyl alcohol.

According to the present invention, the photosensitive emulsion containing such an anti-forming agent is applied to a substrate by a coating device such as a roll, air-knife, curtain or slit coater and dried to give a photosensitive material having an excellent foam-free appearance.

The plastic film to be used as a substrate may be a film made of polyethylene terephthalate, polycarbonate, polystyrene, polyvinyl chloride, cellulose actate or the like.

The present invention also relates to a photosensitive coating emulsion for a plastic film comprising an emulsion containing a film-forming polymer and a photocrosslinkable polyvinyl alcohol containing at least one photocrosslinkable constituent unit selected from the group consisting of units represented by the general formula (I):

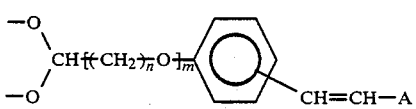

wherein A is a group represented by the general formula:

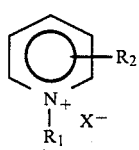

or

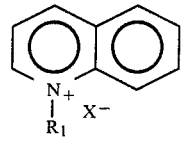

wherein $R^1$ represents a hydrogen atom or an alkyl or aralkyl group which may contain a hydroxyl or carbamoyl group or an ether or unsaturated bond, $R^2$ represents a hydrogen atom or a lower alkyl group, $X^-$ represents an anion, m represents 0 or 1, and n represents a positive number of 1 to 6, and units represented by the general formula (IV):

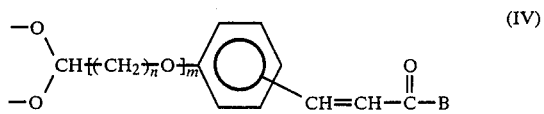

or the general formula (V):

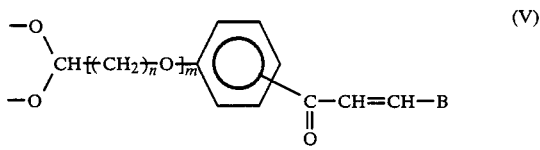

wherein B represents an aromatic or heterocyclic group having at least one polar group and m and n are as defined above, characterized in that the dispersion medium of the photosensitive emulsion comprises 95 to 50% by weight of water and 5 to 50% by weight of at least one lower aliphatic alcohol selected from the group consisting of methyl, ethyl, n-propyl and i-propyl alcohols.

Although the dispersion medium of this emulsion according to the present invention contains 5 to 50% by weight of the specified lower aliphatic alcohol, the presence of the alcohol does not adversely affect the state of the emulsion. Further, when this photosensitive emulsion is applied to a plastic film and dried, the drying characteristics are not remarkably lowered and neither foaming nor cissing occurs.

The inventors of the present invention attempted the use of organic solvents other than the above specified lower aliphatic alcohols, for example, aliphatic alcohols such as butyl alcohol, acetates such as ethyl acetate or glycol ethers such as Ethyl Cellosolve together with water as one component of the dispersion medium. However, all of the attempted solvents exhibited poor solubility in water or poor drying characteristics, caused cissing or remarkably enhanced the viscosity of the photosensitive emulsion to result in difficult use.

Further, it was attempted to add a known anti-foaming agent such as mineral oil, fatty oil, fatty acid, fatty acid ester, silicone, fluorine compound, polyalkylene glycol or the like. However, these anti-foaming agents could sufficiently prevent neither foaming nor cissing. However these anti-foaming agents may be used together with the dispersion medium of the present invention.

Examples of the lower aliphatic alcohol to be used together with water as a component of the dispersion medium in the present invention include methyl, ethyl, propyl and isopropyl alcohols and mixtures of two or more of these alcohols.

The alcohol content of the dispersion medium is 5 to 50% by weight, preferably 10 to 40% by weight, based on the total amount of water and the alcohol.

If the alcohol content is less than 5% by weight, no effect will be obtained, while if it exceeds 50% by weight, the stability of the emulsion will be lowered to resulting in difficult coating.

The dispersion medium of the present invention can be prepared by adding a mixture of the lower aliphatic alcohol and water to the photosensitive emulsion, by adding such a mixture during the preparation of the photosensitive emulsion, by using such a mixture as a solvent for the polyvinyl alcohol or the like, or by the combination thereof.

Thus, the present invention also relates to a photosensitive coating emulsion for a plastic film comprising an emulsion containing a film-forming polymer and a photocrosslinkable polyvinyl alcohol containing at least one photocrosslinkable constituent unit selected from the group consisting of units represented by the general formula (I):

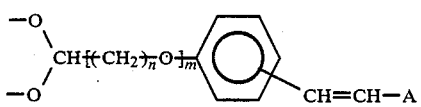

wherein A is a group represented by the general formula:

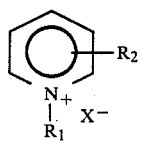

or

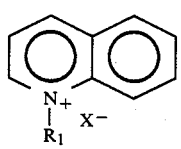

wherein $R^1$ represents a hydrogen atom or an alkyl or aralkyl group which may contain a hydroxyl or carbamoyl group or an ether or unsaturated bond, $R^2$ stands for a hydrogen atom or a lower alkyl group, and $X^-$ represents an anion, m represents 0 or 1, n represents a positive member of 1 to 6, and units represented by the general formula (IV):

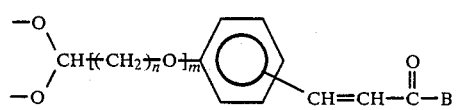

or the general formula (V):

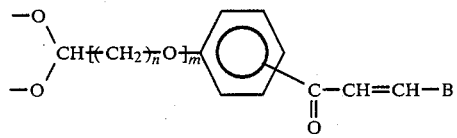

wherein B represents an aromatic or heterocyclic group having at least one polar group and m and n are as defined above, characterized by further containing an acetylenic glycol or alcohol as an anti-foaming agent.

Although this photosensitive emulsion contains the above described anti-foaming agent, the presence of the anti-foaming agent does not adversely affect the state of the emulsion. Further, when this photosensitive emulsion is applied to a plastic film and dried, the drying characteristics are not remarkably lowered and neither foaming nor cissing occurs.

The acetylenic glycol or alcohol to be used as an anti-foaming agent in the present invention may be 2,4,7,9-tetramethyl-5-decyne-4,7-diol, 3,6-dimethyl4-octyne-3,6-diol, solutions thereof in ethylene glycol or 2-ethylhexyl alcohol, adducts of 2,4,7,9-tetramethyl-5-decyne-4,7-diol with 3 to 30 mol of ethylene oxide and combination of two or more of them. The amount of the anti-foaming agent is 0.01 to 5% by weight, preferably 0.1 to 1.0% by weight based on the amount of the photosensitive emulsion.

These acetylenic glycols or alcohols may be used together with other ordinary anti-foaming agents.

EXAMPLES AND EFFECTS

Now, the present invention will be described in more detail by referring to the following Examples.

REFERENTIAL EXAMPLE 1

110 g of N-methyl-γ-picolinium methosulfate and 200 g of terephthalaldehyde were dissolved in 400 ml of methanol under heating and 6 ml of piperidine was added thereto. The obtained mixture was refluxed for 3 hours, cooled and distilled under a reduced pressure to remove the ethanol. The residue was washed with ethyl acetate to obtain a precipitate. The precipitate was dissolved in hot ethanol and ethyl acetate was gradually added thereto to obtain a crystal. This crystal was washed with ethyl acetate and dried to obtain 120 g of N-methyl-γ-(p-formylstyryl)pyridinium methosulfate.

REFERENTIAL EXAMPLE 2

(Preparation of a photocrosspolyvinyl linkable polyvinyl alcohol)

9 g of the N-methyl-γ-(p-formylstyryl)pyridinuim methosulfate prepared in Referential Example 1 and 100 g of a polyvinyl alcohol having a degree of saponification of 88 molar % and a degree of polymerization of 1700 were dissolved in 900 ml of water under heating. 5 g of 85% phosphoric acid was added to the resulting solution. The obtained mixture was stirred at 60° C. under heating for 5 hours and then at an ordinary temperature for 24 hours, and poured into a large amount of acetone to obtain a precipitate. This precipitate was sufficiently washed with methanol twice and dried to obtain 98 g of a resin. The resin contained about 1.2 molar % of stilbazolium units based on the total constituent unit of the polyvinyl alcohol.

EXAMPLES 1 TO 4 AND COMPARATIVE EXAMPLES 1 TO 3

A photosensitive emulsion having the following composition was prepared:

| | |
|---|---|
| polyvinyl acetate emulsion (solid content: 50% by weight) | 140 parts by weight |
| photocrosslinkable polyvinyl alcohol (Referential Example 2) (solid content: 10% by weight) | 300 parts by weight |
| coloring material | a slight amount |
| water | 200 parts by weight |

An aliphatic alcohol having eight carbon atoms according to the present invention, a commercially available anti-foaming agent and other four compounds were added to 1000 parts by weight of the above photosensitive emulsion each in an amount given in Table 1, followed by mixing. The obtained mixture was applied to a biaxially oriented film made of polyethylene terephthalate having a thickness of 75 μm with a curtain coater and dried with a hot air of 60° C. to form a photosensitive coating film having a thickness of 30 μm. The coating film was examined for surface appearance and the results are shown in Table 1.

The photosensitive materials for screen processing prepared in Examples 1 to 4 were each applied to a 250-mesh polyester screen stuck on a wooden frame with water and dried by ventilation to peel the polyester film.

The obtained screen plate was contacted with a positive original, irradiated with an ultra-high pressure mercury vapor lamp of 3 kW at a distance of 1 m for 30 sec and washed with water shower of an ordinary temperature to carry out the development. The developed screen plate was dried to give a pinhole-free screen printing plate having a excellent edge sharpness wherein a fine line having a width of about 100 μm was reproduced.

On the other hand, many pinholes were observed on the surface of the screen printing plates produced with the photosensitive materials of Comparative Examples 1 to 3.

TABLE 1

| | | Anti-foaming agent | Amount (part) | Surface appearance Foaming | Cissing |
|---|---|---|---|---|---|
| Ex. | 1 | 1-octyl alcohol | 0.005 | not observed | not observed |
| | 2 | 1-octyl alcohol | 0.01 | not observed | not observed |
| | 3 | 1-octyl alcohol | 0.05 | not observed | not observed |
| | 4 | 2-octyl alcohol | 0.01 | not observed | not observed |
| Comp. Ex. | 1 | silicone anti-foaming (San Nopco 8034: a product of San Nopco Ltd.) | 0.2 | not observed | observed |
| | 2 | Pluronic anti-foaming agent (Pronal P-855: a product of Toho Chemical Industry Co., Ltd.) | 5 | not observed | observed |
| | 3 | 1-butyl alcohol | 10 | observed | not observed |

EXAMPLE 5

The same photosensitive emulsion as the one described in Example 2 except that the dispersion medium comprised 30% by weight of methanol and 70% by weight of water was prepared. A photosensitive coating film was prepared by the use of this emulsion in a similar manner to the one described in Example 1. This film had an excellent surface free from foaming or cissing and exhibited excellent image-forming characteristics.

EXAMPLE 6

One part by weight of a solution of 2,4,7,9-tetramethyl-5-decyne-4,7-diol in ethylene glycol having a solid content of 50% by weight was further added to 1000 parts by weight of the same photosensitive emulsion as the one used in Example 5.

A photosensitive coating film was prepared by the use of the obtained mixture in a similar manner to the one described in Example 1. This coating film had an excellent surface free from foaming or cissing and exhibited good image-forming characteristics.

EXAMPLES 7 TO 13 AND COMPARATIVE EXAMPLES 4 to 7

A photosensitive emulsion having the following formulation was prepared:

| | |
|---|---|
| polyvinyl acetate emulsion (solid content: 50% by weight) | 140 parts by weight |
| photocrosslinkable polyvinyl alcohol (Referential Example 2) (solid content: 10% by weight) | 300 parts by weight |
| coloring material | a slight amount |
| liquid mixture (the components and the ratio are as shown in Table 2) | 200 parts by weight |

A photosensitive emulsion was prepared by mixing the above aqueous solution of photocrosslinkable polyvinyl alcohol with the above polyvinyl acetate emulsion and the above coloring material under stirring and diluting the obtained mixture with the above liquid mixture under stirring. The obtained photosensitive emulsion was applied to one surface of a biaxially oriented film made of polyethylene terephthalate having a thickness of 75 μm with a curtain coater and dried with a hot air of 60° C. to form a photosensitive coating film having a thickness of 30 μm. The coating film was examined for surface appearance and the results are shown in Table 2.

The photosensitive materials for screen processing prepared in Examples 7 to 13 were each applied to a 250-mesh polyester screen stuck on a wooden frame with water and dried by ventilation to peel the polyester film.

The obtained screen plate was contacted with a positive original, irradiated with an ultra-high pressure mercury vapor lamp of 3 kW at a distance of 1 m for 30 sec and washed with water shower of an ordinary temperature to carry out the development. The developed screen plate was dried to give a pinhole-free screen printing plate having an excellent edge sharpness wherein a fine line having a width of about 100 μm was reproduced.

On the other hand, many pinholes were observed on the surface of the screen printing plates produced with the photosensitive materials of Comparative Examples 4 to 7. Particularly, the screen printing plate produced with the material of Comparative Example 7 had a poor surface appearance and the surface was highly sticky.

TABLE 2

|  |  | Dispersion medium of photosensitive emulsion |  | Increase in the viscosity of emulsion | Appearance |  | drying characteristics |
|---|---|---|---|---|---|---|---|
|  |  | liquid mixture | weight ratio |  | foaming | cissing |  |
| Ex. | 7 | methanol/water | 5/95 | not observed | not observed | not observed | good |
|  | 8 | " | 10/90 | " | not observed | not observed | " |
|  | 9 | " | 30/70 | " | not observed | not observed | " |
|  | 10 | ethanol/water | 10/90 | " | not observed | not observed | " |
|  | 11 | propyl alcohol/water | " | " | not observed | not observed | " |
|  | 12 | isopropyl alcohol/water | " | " | not observed | not observed | " |
|  | 13 | methanol/isopropyl alcohol/water | 20/10/70 | " | not observed | not observed | " |
| Comp. Ex. | 4 | butyl acetate | 5/95 | " | not observed | observed | " |
|  | 5 | butyl alcohol | " | " | observed | not observed | " |
|  | 6 | ethyl acetate | 10/90 | " | not observed | observed | " |
|  | 7 | ethyl cellosolve | " | observed | not observed | not observed | poor |

| | |
|---|---|
| polyvinyl acetate emulsion (solid content: 50% by weight) | 140 parts by weight |
| photocrosslinkable polyvinyl alcohol (Referential Example 2) (solid content: 10% by weight) | 300 parts by weight |
| coloring material | a slight amount |
| water | 200 parts by weight |

EXAMPLE 14

A photosensitive emulsion was prepared by the use of a solution of the photocrosslinkable polyvinyl alcohol of Referential Example 2 in a methanol/water mixture of a weight ratio of 50:50 having a solid content of 20% by weight in a similar manner to the one described in Example 9. The dispersion medium of this emulsion comprised 50% of methanol and 50% of water. A coating film was prepared by the use of this emulsion in a similar manner to the one described in Example 9. This coating film had a surface free from foaming or cissing.

EXAMPLE 15

One part by weight of a solution of 2,4,7,9-tetramethyl-5-decyne-4,7-diol in ethylene glycol having a solid content of 50% by weight was added to the same photosensitive emulsion as the one used in Example 9 as an anti-foaming agent. The mixture was stirred to form a photosensitive emulsion. A photosensitive coating film was formed by the use of this photosensitive emulsion in a similar manner to the one described in Example 9. This coating film had an excellent appearance free from foaming or cissing and exhibited excellent image-forming characteristics. Examples 16 to 20 and Comparative Examples 8 to 11

A photosensitive emulsion having the following formulation was prepared:

Four acetylenic glycols and four commercially available anti-foaming agents were added to 1000 parts by weight of the above photosensitive emulsion each in an amount shown in Table 3, followed by mixing. The obtained mixture was applied to one surface of a biaxially oriented film made of polyethylene terephthalate having a thickness of 75 μm with a curtain coater and dried with a hot air of 60° C. to form a photosensitive coating film having a thickness of 30 um. The coating film was examined for surface appearance and the results are shown in Table 3.

The photosensitive materials for screen processing prepared in Examples 16 to 20 were each applied to a 250-mesh polyester screen stuck on a wooden frame with water and dried by ventilation to peel the polyester film.

The obtained screen plate was contacted with a positive original, irradiated with an ultra-high pressure mercury vapor lamp of 3 kW at a distance of 1 m for 30 sec and washed with water shower of an ordinary temperature to carry out the development. The developed screen plate was dried to give a pinhole-free screen printing plate having an excellent edge sharpness wherein a fine line having a width of about 100 μm was reproduced.

On the other hand, many pinholes were observed on the surface of the screen printing plates produced with the photosensitive materials of Comparative Examples 8 to 11.

TABLE 3

| | | Anti-foaming agent | Amount (part by weight) | Coating film foaming | Coating film cissing |
|---|---|---|---|---|---|
| Ex. | 16 | (I)*1 | 5 | not observed | not observed |
| | 17 | 50 % solution of (I) in ethylene glycol | 1 | " | " |
| | 18 | | 10 | " | " |
| | 19 | adduct of (I) with 3.5 mol of ethylene oxide | 2 | " | " |
| | 20 | 3,5-dimethyl-1-hexyn-3-ol | 2 | " | " |
| Comp. Ex. | 8 | silicone anti-foaming agent (Nopco 8034: product of San Nopco Ltd.) Pluronic anti-foaming agent | 0.2 | " | observed |
| | 9 | (Pronal P-855: a product of Toho Chemical Industry Co., Ltd.) mineral oil anti-foaming agent | 5 | " | " |
| | 10 | (Pronal P-822: a product of Toho Chemical Industry Co., Ltd.) fluorocarbon anti-foaming agent | 5 | observed | " |
| | 11 | (Surflon S-341: a product of Asahi Glass Co., Ltd.) | 0.5 | observed | not observed | note*1(I): 2,4,7,9-tetramethyl-5-decyne-4,7-diol

EXAMPLE 21

The same photosensitive emulsion as the one described in Example 18 except that the dispersion medium comprised 30% by weight of methanol and 70% by weight of water was prepared. A photosensitive coating film was formed by the use of this emulsion in a similar manner to the one described in Example 3. This coating film had a good appearance free from foaming or cissing and exhibited excellent image-forming characteristics.

What is claimed is:

1. A photosensitive coating emulsion consisting essentially of a film-forming polymer and a photocrosslinkable polyvinyl alcohol having a degree of saponification of 75 molar % or above and an average degree of polymerization of 300 to 3000 and containing at least one photocrosslinkable constituent unit present in an amount of 0.5 to 10 molar % based on said photocrosslinkable polyvinyl alcohol, and selected from the group consisting of units represented by the general formula (I):

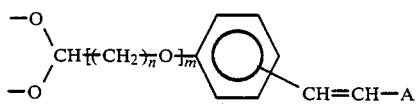

(I)

wherein A is a group represented by the general formula (II) or (III):

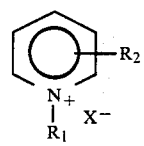

(II)

or

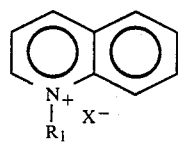

(III)

wherein:

$R^1$ represents a hydrogen atom, an alkyl group or an aralkyl group which may contain a hydroxyl, a carbamoyl group, an ether or an unsaturated bond,
$R^2$ represents a hydrogen atom or a lower alkyl group, $X^-$ represents an anion, m represents 0 or 1, and n represents a positive number of 1 or 6, and units represented by the general formula (IV):

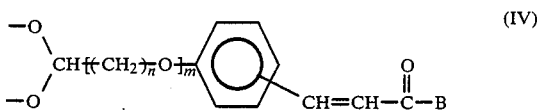

(IV)

or the general formula (V):

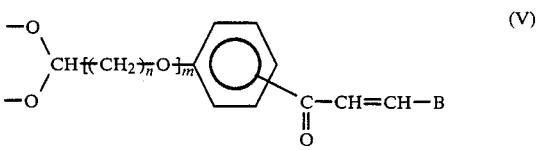

(V)

wherein B represents an aromatic or a heterocyclic group having at least one polar group and m and n are as defined above,
dispersed in a dispersion medium
which comprises 95 to 50% by weight of water and 5 to 50% by weight of at least one lower aliphatic alcohol as an anti-foaming agent where672 in said lower aliphatic alcohol is present in an amount of 0.001 to 0.01% by weight based on the amount of said photosensitive emulsion and is selected from the group consisting of methyl, ethyl, n-propyl and i-propyl alcohols, said photocrosslinkable constituent unit is present in an amount of from 0.5 to 10 molar % based on said constituent unit of said polyvinyl alcohol, and wherein the weight ratio of said emulsion containing said film forming polymer to said photocrosslinkable polyvinyl alcohol is between 100:10 and 100:200.

2. The photosensitive coating emulsion of claim 1, wherein the emulsion containing the film forming polymer is selected from the group consisting of vinyl acetate emulsion, acrylic emulsion, ethylene-vinyl acetate emulsion, ethylene-acrylic emulsion, SBR latex, vinyl chloride emulsion and vinylidene chloride emulsion.

3. The photosensitive coating emulsion of claim 1, wherein the dispersion medium contains 10 to 40% by weight of said at least one lower aliphatic alcohol.

4. A photosensitive coating emulsion consisting essentially of a film-forming polymer and a photocrosslinkable polyvinyl alcohol having a degree of saponification of 75 molar % or above and an average degree of polymerization of 300 to 3000 and containing at least one photocrosslinkable constituent unit present in an amount of 0.5 to 10 molar percent band on said photopolymerizable polyvinyl alcohol, and selected from the group consisting of units represented by the general formula (I):

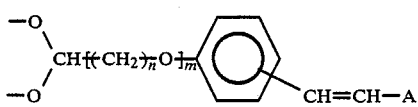

wherein A is a group represented by the general formula (II) or (III):

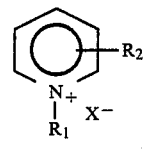

or

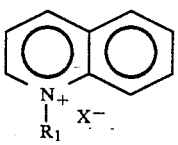

wherein:
R$^1$ represents a hydrogen atom, an alkyl group or an aralkyl group which may contain a hydroxyl, a carbamoyl group, an ether or an unsaturated bond,
R$^2$ represents a hydrogen atom or a lower alkyl group, X$^-$ represents an anion, m represents 0 or 1, and n represents a positive number of 1 to 6,
and units represented by the general formula (IV):

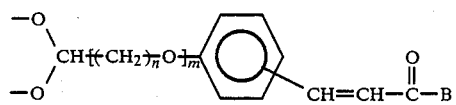

or the general formula (V):

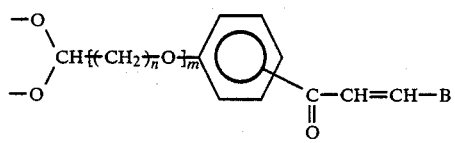

wherein B represents an aromatic or heterocyclic group having at least one polar group and m and n are as defined above, and 0.01 to 5% of an acetylenic glycol or alcohol as an anti-foaming agent in an aqueous solution, said photocrosslinkable unit is present in an amount of from 0.5 to 10 molar % based on said polyvinyl alcohol and wherein the weight ratio of said emulsion containing said film-forming polymer to said photocrosslinkable polyvinyl alcohol is between 100:10 and 100:200.

5. The photosensitive coating emulsion of claim 4, wherein the emulsion containing the film forming polymer is selected from the group consisting of vinyl acetate emulsion, acrylic emulsion, ethylene-vinyl acetate emulsion, ethylene-acrylic emulsion, SBR latex, vinyl chloride emulsion and vinylidene chloride emulsion.

6. The photosensitive coating emulsion of claim 4, wherein the acetylenic glycol or alcohol is 2,4,7,9-tetramethyl-5-decyne-4,7-diol, 3,6-dimethyl-4-octyne-3,6-diol, and solutions thereof in ethylene glycol or 2-ethylhexyl alcohol, adducts of 2,4,7,9-tetramethyl-5-decyne-4,7-diol with 3 to 30 mol of ethylene oxide or combinations thereof.

7. A photosensitive coating emulsion consisting essentially of a film-forming polymer and a photocrosslinkable polyvinyl alcohol containing at least one photocrosslinkable constituent unit selected from the group consisting of units represented by the general formula (I):

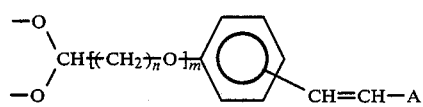

wherein A is a group represented by the general formula (II) or (III)):

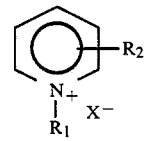

or

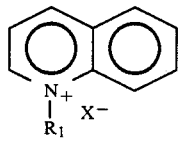

wherein:
R$^1$ represents a hydrogen atom, an alkyl group, or an aralkyl group which may contain a hydroxyl, a carbamoyl group, an ether or an unsaturated bond,
R$^2$ represents a hydrogen atom or a lower alkyl group, and X$^-$ represents an anion, m represents 0 or 1, and n represents a positive number of 1 to 6,
and units represented by the general formula (IV):

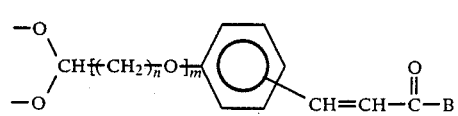

or the general formula (V):

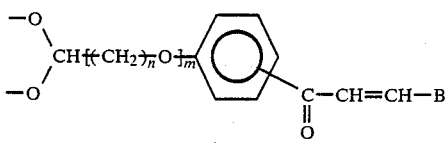 (V)

wherein B represents an aromatic or heterocyclic group having at least one polar group and m and n are as defined above, and 0.01 to 5% of an acetylenic glycol or alcohol as an anti-foaming agent in an aqueous solution, said photocrosslinkable polyvinyl alcohol having a degree of saponification of 75 molar % or above and an average degree of polymerization of 300 to 3000, and wherein the weight ratio of said emulsion containing said film-forming polymer to said photocrosslinkable polyvinyl alcohol is between 100:10 and 100:200 and said photocrosslinkable constituent unit is present in an amount of from 0.5 to 10 molar % based on said constituent unit of said polyvinyl alcohol.

8. A photosensitive coating emulsion consisting essentially of a film-forming polymer and a photocrosslinkable polyvinyl alcohol having a degree of saponification of 75 molar % or above and an average degree of polymerization of 300 to 3000 and containing at least one photocrosslinkable constituent unit selected from the group consisting of units represented by the general formula (I):

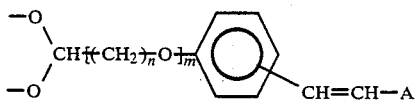 (I)

wherein A is a group represented by the general formula (II) or (III):

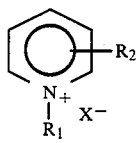 (II)

or

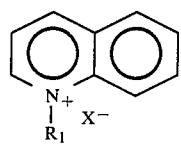 (III)

wherein
R$^1$ represents a hydrogen atom, an alkyl group or an aralkyl group which may contain a hydroxyl, a carbamoyl group, an ether or an unsaturated bond,
R$^2$ represents a hydrogen atom or a lower alkyl group, X$^-$ represents an anion, m represents 0 or 1, and n represents a positive number of 1 to 6, and units represented by the general formula (IV):

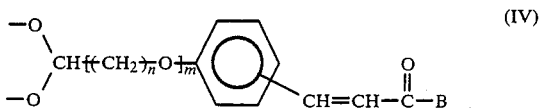 (IV)

or the general formula (V):

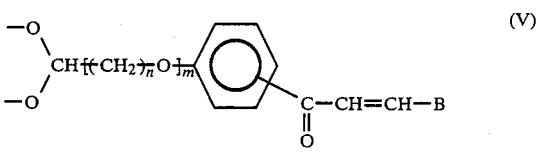 (V)

wherein B represents an aromatic or heterocyclic group having at least one polar group and m and n are as defined above,
dispersed in a dispersion medium which comprises 95 to 50% by weight of water and 5 to 50% by weight of at least one lower aliphatic alcohol as an antifoaming agent wherein said lower aliphatic alcohol is present in an amount of 0.001 to 0.01% by weight based on the amount of said photosensitive emulsion and is selected from the group consisting of methyl, ethyl, n-propyl and i-propyl alcohols, said photocrosslinkable constituent unit is 0.5 to 10 molar % based on said constituent unit of said polyvinyl alcohol, and wherein the weight ratio of said emulsion containing the film forming polymer to the photocrosslinkable polyvinyl alcohol is between 100:10 and 100:200.

* * * * *